United States Patent
Roach et al.

(10) Patent No.: US 10,422,234 B2
(45) Date of Patent: Sep. 24, 2019

(54) COMPLIANT ATTACHMENT FOR AN ORGANIC MATRIX COMPOSITE COMPONENT

(71) Applicant: United Technologies Corporation, Farmington, CT (US)

(72) Inventors: James T. Roach, Vernon, CT (US); Benjamin T. Fisk, East Granby, CT (US); Grant O. Cook, III, Tolland, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 596 days.

(21) Appl. No.: 15/106,608

(22) PCT Filed: Aug. 14, 2014

(86) PCT No.: PCT/US2014/051112
§ 371 (c)(1),
(2) Date: Jun. 20, 2016

(87) PCT Pub. No.: WO2015/094420
PCT Pub. Date: Jun. 25, 2015

(65) Prior Publication Data
US 2016/0326891 A1 Nov. 10, 2016

Related U.S. Application Data

(60) Provisional application No. 61/919,038, filed on Dec. 20, 2013.

(51) Int. Cl.
*F01D 5/14* (2006.01)
*F01D 5/30* (2006.01)
(Continued)

(52) U.S. Cl.
CPC .............. *F01D 5/282* (2013.01); *C09J 5/00* (2013.01); *C23C 14/22* (2013.01); *C23C 16/44* (2013.01);
(Continued)

(58) Field of Classification Search
CPC .......... F01D 5/282; F01D 5/3061; F01D 5/30; F01D 11/08; F01D 25/005; F01D 9/041;
(Continued)

(56) References Cited

U.S. PATENT DOCUMENTS

| 4,790,723 A | 12/1988 | Wilson et al. |
| 6,132,175 A | 10/2000 | Cai et al. |

(Continued)

FOREIGN PATENT DOCUMENTS

| EP | 2072833 A2 | 6/2009 |
| JP | H08213512 | 8/1996 |

OTHER PUBLICATIONS

European Search Report for European Application No. 14871082.5, dated Oct. 12, 2017, 8 pages.
(Continued)

*Primary Examiner* — Ninh H. Nguyen
*Assistant Examiner* — Maxime M Adjagbe
(74) *Attorney, Agent, or Firm* — Cantor Colburn LLP

(57) ABSTRACT

A compliant attachment for an organic matrix composite component that is configured to interface with a mating component is disclosed. The compliant attachment may comprise an inner surface configured to bond to an interfacing surface of a body portion of the organic matrix component, and an outer surface configured to interface with the mating component. The compliant attachment may have a coefficient of thermal expansion intermediate between a coefficient of thermal expansion of the body portion of the
(Continued)

organic matrix composite component and a coefficient of thermal expansion of the mating component.

14 Claims, 4 Drawing Sheets

(51) Int. Cl.

| | | |
|---|---|---|
| *F01D 5/28* | (2006.01) | |
| *C09J 5/00* | (2006.01) | |
| *F01D 11/08* | (2006.01) | |
| *F01D 25/24* | (2006.01) | |
| *C23C 14/22* | (2006.01) | |
| *C23C 16/44* | (2006.01) | |
| *C23C 18/16* | (2006.01) | |
| *C23C 24/04* | (2006.01) | |
| *F01D 9/04* | (2006.01) | |
| *F01D 25/00* | (2006.01) | |

(52) U.S. Cl.
CPC .......... *C23C 18/1633* (2013.01); *C23C 24/04* (2013.01); *F01D 5/3061* (2013.01); *F01D 9/041* (2013.01); *F01D 11/08* (2013.01); *F01D 25/005* (2013.01); *F01D 25/246* (2013.01); *C09J 2400/163* (2013.01); *F05D 2230/23* (2013.01); *F05D 2230/237* (2013.01); *F05D 2240/11* (2013.01); *F05D 2240/12* (2013.01); *F05D 2240/30* (2013.01); *F05D 2260/941* (2013.01); *F05D 2300/603* (2013.01)

(58) Field of Classification Search
CPC ......... F05D 2260/941; F05D 2230/237; F05D 2300/603; C23C 14/22; C23C 16/44; C23C 18/1633; C23C 24/04
See application file for complete search history.

(56) References Cited

U.S. PATENT DOCUMENTS

| | | | |
|---|---|---|---|
| 7,329,101 B2* | 2/2008 | Carper | .................. C04B 35/565 |
| | | | 416/219 R |
| 7,776,433 B2* | 8/2010 | Ronk | ......................... C08J 7/04 |
| | | | 428/323 |
| 8,292,537 B2 | 10/2012 | Newswander | |
| 2008/0078163 A1 | 4/2008 | Burdick et al. | |
| 2008/0206575 A1 | 8/2008 | Ronk et al. | |
| 2011/0236222 A1* | 9/2011 | McFeat | ..................... B22C 7/06 |
| | | | 416/97 R |
| 2012/0251305 A1* | 10/2012 | McMillan | ................. F01D 5/28 |
| | | | 415/182.1 |
| 2013/0276459 A1 | 10/2013 | Roberts et al. | |
| 2014/0079559 A1* | 3/2014 | Luczak | ................ F01D 5/3007 |
| | | | 416/248 |

OTHER PUBLICATIONS

Notification of Transmittal of the International Search Report and the Written Opinion of the International Searching Authority, or the Declaration; PCT/US2014/051112; dated Nov. 25, 2014.

* cited by examiner

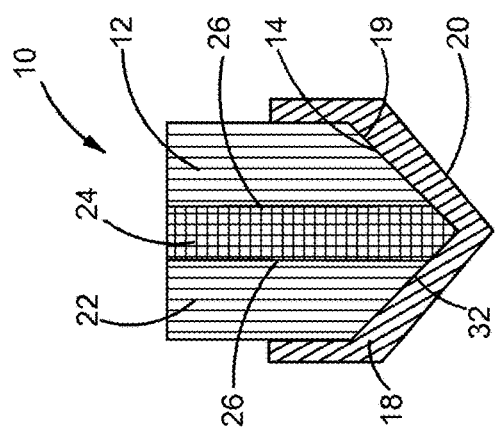
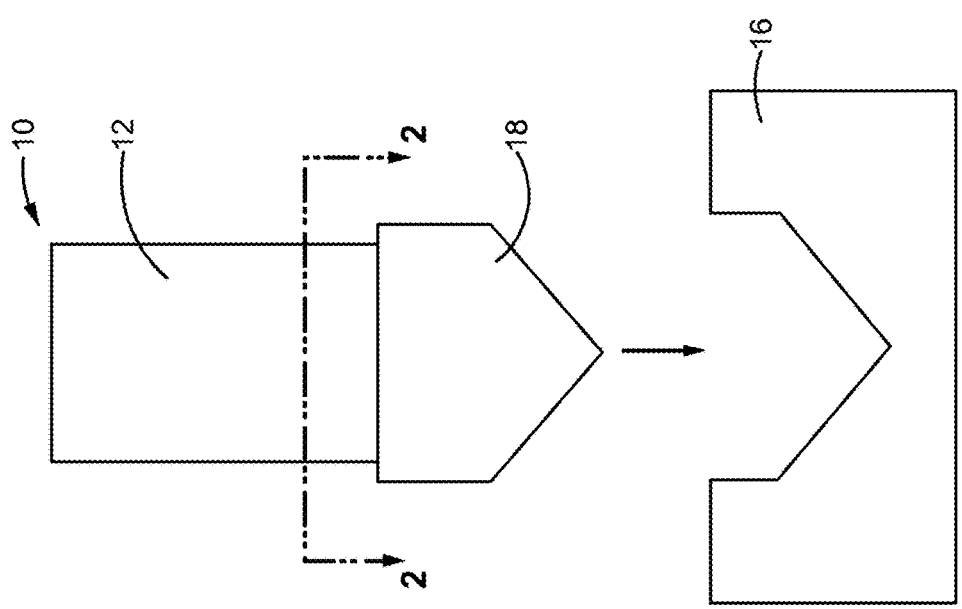

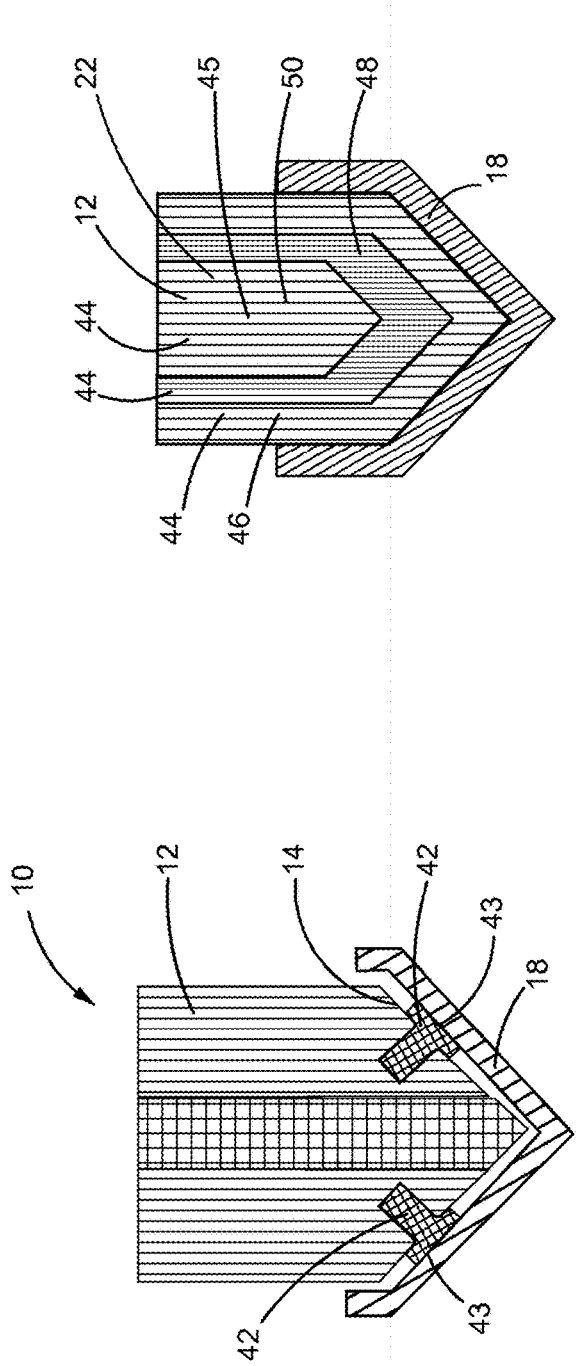
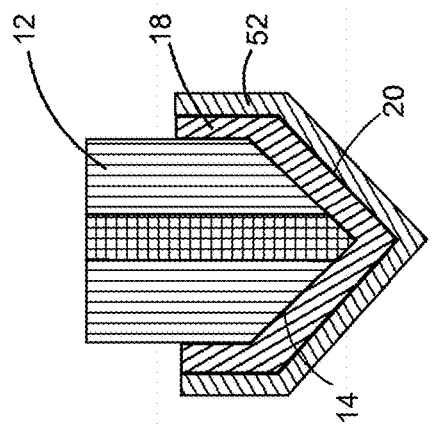
FIG. 6
FIG. 7
FIG. 8

COMPLIANT ATTACHMENT FOR AN ORGANIC MATRIX COMPOSITE COMPONENT

The application is a National Phase Application of Patent Application PCT/US2014/051112 filed on Aug. 14, 2014, which claims the benefit of and priority to U.S. Provisional Patent Application No. 61/919,038, filed Dec. 20, 2013, the contents each of which are incorporated herein by reference in their entirety.

FIELD OF DISCLOSURE

The present disclosure generally relates to organic matrix composite components, and more specifically, relates to compliant attachments for organic matrix composite components that are capable of mitigating interfacial strain between organic matrix composite components and mating structures with differing thermal properties.

BACKGROUND

Composite materials are lightweight and high-strength materials that may be used for component fabrication in various industries, such as aerospace, automotive, and sports industries. They generally consist of reinforcing elements embedded in a matrix that binds the reinforcing elements together. Organic matrix composites (OMCs) are a class of composite materials in which the matrix consists of an organic material such as one or more polymer resins. The reinforcing elements in OMCs (as well as other types of composite materials) may include fibers such as carbon fibers, glass fibers, boron fibers, and aramid fibers.

OMCs may exhibit a laminated structure in which layers of fibers (or "laminae") are stacked to provide a desired part thickness and geometry. The fibers in each layer may be aligned in parallel (or "unidirectional"), they may be randomly oriented, or they may be organized in a two-dimensional woven architecture such as a plane weave. In other cases, the fibers may have a three-dimensional woven architecture wherein the fiber threads may be interlocked by three-dimensional weaving.

While OMC laminates may be associated with high in-plane stiffness (i.e., in the plane of the fiber layers), they may exhibit weak inter-laminar strengths such that they may be susceptible to delamination (i.e., the pulling apart of individual lamina in the laminate) and loss in structural integrity, particularly at the exposed surfaces of the laminate part. The susceptibility of OMC composite laminates toward delamination may be greater at contact interfaces between OMC part surfaces and mating structures with different thermal properties, especially when there is relative motion between the OMC part and the mating structure. More specifically, mismatches in the coefficients of thermal expansion (CTE) between OMC components and their mating structures may cause thermal strain at the contact interfaces, leading to possible delamination and structural wear starting at the exposed surfaces of the OMC part. In this regard, it remains a challenge to provide robust connection interfaces between OMC parts and mating structures having differing thermal properties.

An attempt to protect OMC components from high temperature stress using a thermal oxidative barrier coating has been described in U.S. Patent Application Number 2008/0206575. In addition, U.S. Pat. No. 6,132,175 describes the mitigation of contact damage stress between ceramic airfoils and metallic support structures having different CTEs using a multi-layer compliant sleeve that slideably engages a ceramic root and rests between the ceramic airfoil root and the metallic support structure during operation. However, neither of these systems provides a strategy for protecting OMC parts from structural wear at contact interfaces with mating structures.

Clearly, there is a need for systems that mitigate interfacial strain between OMC components and mating structures with thermal expansion mismatches.

SUMMARY

In accordance with one aspect of the present disclosure, an organic matrix composite component is disclosed. The organic matrix composite component may comprise a body portion formed from an organic matrix composite and having an interfacing surface configured to interface with a mating component. The organic matrix composite component may further comprise a compliant attachment bonded to the interfacing surface of the body portion. The compliant attachment may have a coefficient of thermal expansion intermediate between a coefficient of thermal expansion of the body portion and a coefficient of thermal expansion of the mating component.

In another refinement, the interfacing surface of the body portion may be plated with at least one metallic layer.

In another refinement, the compliant attachment may be bonded to the interfacing surface of the body portion by a bonding method selected from the group consisting of transient liquid phase bonding, partial transient liquid phase bonding, and brazing.

In another refinement, the compliant attachment may be bonded to the interfacing surface of the body portion by adhesive bonding.

In another refinement, the interfacing surface of the body portion may comprise at least one molded insert.

In another refinement, an exposed surface of the at least one molded insert may be plated with at least one metallic layer.

In another refinement, the compliant attachment may be bonded to the at least one molded insert by a method selected from the group consisting of transient liquid phase bonding, partial transient liquid phase bonding, and brazing.

In another refinement, the organic matrix composite component may further comprise a second compliant attachment bonded to an outer surface of the compliant attachment. The second compliant attachment may have a coefficient of thermal expansion intermediate between the coefficient of thermal expansion of the compliant attachment and the coefficient of expansion of the mating component.

In another refinement, the organic matrix composite may comprise a laminated structure.

In another refinement, the organic matrix composite may further comprise a 3D woven composite.

In accordance with another aspect of the present disclosure, a gas turbine engine component is disclosed. The gas turbine engine component may comprise a body portion formed from an organic matrix composite and it may have an interfacing surface configured to interface with a mating component. The gas turbine engine component may further comprise a compliant attachment bonded to the interfacing surface of the body portion. The compliant attachment may have a coefficient of thermal expansion intermediate between a coefficient of thermal expansion of the body portion and a coefficient of thermal expansion of the mating component.

In another refinement, the compliant attachment may be configured to bond to the interfacing surface of the body portion by a bonding method selected from the group consisting of transient liquid phase bonding, partial transient liquid phase bonding, and brazing.

In another refinement, the compliant attachment may be configured to bond to the interfacing surface of the body portion by adhesive bonding.

In another refinement, the compliant attachment may be configured to bond to at least one molded insert on the interfacing surface of the body portion by a bonding method selected from the group consisting of transient liquid phase bonding, partial transient liquid phase bonding, brazing, and adhesive bonding.

In accordance with another aspect of the present disclosure, a method for fabricating an organic matrix composite component configured to interface with a mating component is disclosed. The method may comprise: 1) fabricating a body portion of the organic matrix composite component, and 2) bonding a compliant attachment to an interfacing surface of the body portion. The compliant attachment may have a coefficient of thermal expansion intermediate between a coefficient of thermal expansion of the body portion and a coefficient of thermal expansion of the mating component.

In another refinement, the method may further comprise plating the interfacing surface of the body portion with at least one metallic layer prior to bonding the compliant attachment to the interfacing surface.

In another refinement, bonding the compliant attachment to the interfacing surface may be performed using a bonding method selected from the group consisting of transient liquid phase bonding, partial transient liquid phase bonding, and brazing.

In another refinement, the method may further comprise installing at least one molded insert on the interfacing surface prior to bonding the compliant attachment to the interfacing surface.

In another refinement, bonding the compliant attachment to the interfacing surface may be carried out by bonding the compliant attachment to the at least one molded insert using a bonding method selected from the group consisting of transient liquid phase bonding, partial transient liquid phase bonding, brazing, and adhesive bonding.

These and other aspects and features of the present disclosure will be more readily understood when read in conjunction with the accompanying drawings.

BRIEF DESCRIPTION OF THE DRAWINGS

FIG. 1 is a front view of an OMC component having a body portion and a compliant attachment that is configured to interface with a mating component, constructed in accordance with the present disclosure.

FIG. 2 is a cross-sectional view of the OMC component of FIG. 1 taken along the line 2-2 of FIG. 1, constructed in accordance with the present disclosure.

FIG. 6. is a cross-sectional view similar to FIG. 2, but having molded inserts between the body portion of the OMC component and the compliant attachment, constructed in accordance with the present disclosure.

FIG. 7 is a cross-sectional view similar to FIG. 2, but having sub-laminates in the body portion providing a gradient of coefficients of thermal expansion between the compliant attachment and a core of the OMC component, constructed in accordance with the present disclosure.

FIG. 8 is a cross-sectional view similar to FIG. 2, but having two compliant attachments, constructed in accordance with the present disclosure.

Figure 3:
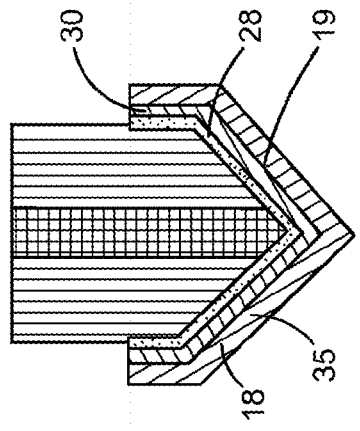
FIG. 3 is a cross-sectional view similar to FIG. 2, but illustrating an interlayer for bonding the body portion of the OMC component to the compliant attachment by transient liquid phase bonding, constructed in accordance with the present disclosure.

It should be understood that the drawings are not necessarily drawn to scale and that the disclosed embodiments are sometimes illustrated diagrammatically and in partial views. In certain instances, details which are not necessary for an understanding of this disclosure or which render other details difficult to perceive may have been omitted. It should be understood, of course, that this disclosure is not limited to the particular embodiments disclosed herein.

DETAILED DESCRIPTION

Referring now to the drawings, and with specific reference to FIGS. 1 and 2, an organic matrix composite (OMC) component 10 is depicted. The OMC component 10 may have a body portion 12 formed from an OMC material and it may have an interfacing surface 14 configured to interface with a mating component 16. In accordance with the present disclosure, the term "interface" may refer to an engagement in a mechanical connection such as, but not limited to, an interlocking fit, a slideable engagement, or a bolted arrangement. Alternatively, it may also refer to an engagement in physical contact with or without relative motion between the two parts. As a non-limiting example, the OMC component 10 may be an airfoil having a root portion (interfacing surface) which interfaces with a slot of a hub (mating component) by a mechanical connection. As another non-limiting example, the OMC component 10 may be a blade outer air seal (BOAS) of a gas turbine engine in physical contact with the tips of rotating airfoils (mating component). However, the OMC component 10 and the mating component 16 may be a variety other of interfacing structures in a range of settings not limited to gas turbine engines. In this regard, it will be understood that the OMC component 10 and the mating component 16 may have any structure suitable for their intended use.

The body portion 12 of the OMC component 10 and the mating component 16 may have differing thermal properties and/or differing compliance properties (i.e., responsiveness to force). More specifically, they may have different coefficients of expansion (CTEs) which may lead to thermal or mechanical strain at the interface between the two parts in response to temperature fluctuations and/or in response to relative motion between the two parts. With time, such strain may lead to delamination (i.e., the pulling or tearing away of lamina) and structural wear of the OMC component 10, particularly at its exposed edges. To mitigate the thermal expansion mismatch between the OMC component 10 and the mating component 16, a compliant attachment 18 may be bonded to the interfacing surface 14 of the OMC component 10, such that it may be positioned between the body portion 12 and the mating component 16 when they are in an interfacing arrangement (see FIG. 1). The compliant attachment 18 may have a shape complementary to the interfacing surface 14 and it may have an inner surface 19 configured to bond to the interfacing surface 14 of the body portion 12 as well as an outer surface 20 configured to interface with the mating component 16 (see FIG. 2). Notably, the compliant attachment 18 may have a CTE intermediate between the CTE of the body portion 12 and the CTE of the mating component 16. In this way, the compliant attachment 18 may assist in transitioning thermal properties between the OMC component 10 and the mating component 16, thereby reducing thermal or mechanical strain between the two parts.

The OMC component 10 may consist of a laminated structure 22, as shown in FIG. 2. The laminated structure 22 may consist of a plurality of stacked laminae and groups of two or more laminae may form a sub-laminate, as will be understood by those with ordinary skill in the art. Each of the laminae may consist of a layer of fibers embedded in a polymer matrix. The fibers may exhibit structurally reinforcing properties and they may consist of various types of fibers such as, but not limited to, carbon fibers, glass fibers, aramid fibers, boron fibers, and combinations thereof. In addition, the fibers in each layer may be oriented in a range of two-dimensional architectures including, but not limited to, a two-dimensional weave, random orientations, or unidirectional orientations in which the fibers may be aligned in parallel. Furthermore, each fiber layer in the laminated structure 22 may consist of different types of fibers and/or types of two-dimensional architectures. The polymer matrix may consist of one or more types of thermoplastic or thermoset materials. Suitable thermoplastic materials for the polymer matrix may include, but are not limited to, polyetherimide (PEI), thermoplastic polyimide, polyether ether ketone (PEEK), polyether ketone ketone (PEKK), polysulfone, polyamide, polyphenylene sulfide, polyester, polyimide, and combinations thereof. Suitable thermoset materials may include, but are not limited to, condensation polyimides, addition polyimides, epoxy cured with aliphatic and/or aromatic amines and/or anhydrides, cyanate esters, phenolics, polyesters, polybenzoxazine, polyurethanes, polyacrylates, polymethacrylates, silicones (thermoset), and combinations thereof.

Optionally, the OMC component 10 may further include a three-dimensional (3D) woven composite 24 which may be located at the core of the body portion 12, as shown in FIG. 2. Alternatively, the OMC component 10 may include one or more 3D composite structures located at various other positions throughout the laminated structure 22. In any event, the 3D woven composite 24 may consist of fibers having a three-dimensional woven architecture (i.e., a three-dimensional weave) embedded in a polymer matrix. The fibers and the polymer matrix in the 3D woven composite 24 may be selected from the fibers and polymer matrices described above. As other possible arrangements, the body portion 12 may consist entirely of the laminated structure 22 or it may consist entirely of the 3D woven composite 24.

As can be appreciated, the laminated structure 22 may be more susceptible to delamination than the 3D woven composite 24 when subjected to mechanical or thermal stress, as the fibers in the 3D woven composite 24 may be held together through interlocking weaves. However, interfacial bonds 26 between the laminated structure 22 and the 3D woven composite 24 may be susceptible to wear as a consequence of thermal/mechanical strain between the OMC component 10 and the mating component 16. Accordingly, the compliant attachment 18 may assist in protecting both the laminated structure 22 from delamination as well as any interfacial bond(s) 26 between the laminated structure 22 and the 3D woven composite 24 from wear.

The mating component 16 may be formed from any suitable nonmetallic or metallic material having a CTE that differs from the CTE of the body portion 12. In addition, the compliant attachment 18 may be formed from any suitable nonmetallic or metallic material having a CTE intermediate between the CTE of the body portion 12 and the CTE of the mating component 16. In some cases, the compliant attachment 18 may be thin and pliable enough to conform to the shape of the interfacing surface 14 of the body portion 12 by conventional shaping techniques. In this regard, the thickness of the compliant attachment 18 may vary depending on the material composition of the compliant attachment 18 and its conformability. For some thinner versions of the compliant attachment 18, the compliant attachment 18 may be integrated into the bond between the body portion 12 and the compliant attachment 18 or it may be co-molded with the body portion 12. However, in other situations, the compliant attachment 18 may be pre-formed in a shape complementary to the interfacing surface 14.

The compliant attachment 18 may be bonded to the interfacing surface 14 of the body portion 12 by any conventional joining process apparent to those skilled in the art such as, but not limited to, transient liquid phase (TLP) bonding, partial transient liquid phase (PTLP) bonding, brazing, or adhesive bonding. In some circumstances, TLP bonding and PTLP bonding may be preferred bonding methods due to the refractory (heat-resistant) nature of the resulting bonds. More specifically, a bond between the body portion 12 and the compliant attachment 18 formed by TLP bonding or PTLP bonding may have a melting temperature that exceeds the bonding temperature that is used to form the bonds. This feature could be beneficial, for example, for high-stress and/or high-temperature applications or when employing temperature-sensitive materials.

If the compliant attachment 18 is bonded to the interfacing surface 14 by TLP bonding, PTLP bonding, or brazing, the interfacing surface 14 of the OMC component 10 may be plated with one or more metallic layers 28 prior to bonding (see FIGS. 3-5 and further details below). In addition, an interlayer 30 may be applied at a bonding interface 32 between the metallic layer 28 and the inner surface 19 of the compliant attachment 18 prior to bonding by TLP bonding, PTLP bonding, or brazing (see FIGS. 3-5 and further details below). The interlayer 30 may exist as various bonding material formats such as, but not limited to, an alloy foil, a pure metal foil, multiple layers of elemental foils, or combinations thereof. Other bonding material formats such as, but not limited to, powder, powder compact, braze paste, sputtered layer, or one or more metallic layers applied by electroplating, physical vapor deposition, or another suitable metal deposition process, may also be used. In some circumstances, the bonding material formats of the interlayer 30 may be selected to further accommodate any thermal expansion and/or compliance mismatches between the body portion 12 and the mating component 16.

Although apparent to those with ordinary skill in the art, the general mechanism of TLP bonding and PTLP bonding in accordance with the present disclosure will now be described. The TLP bonding and PTLP bonding processes may both involve the initial application of the interlayer 30 at the bonding interface 32 between the body portion 12 and the compliant attachment 18. Alternatively, the interlayer 30 may be applied at the periphery of the bonding interface 32 and it may be allowed to flow into the bonding interface 32 by capillary action. In TLP bonding, the interlayer 30 may consist of a single interlayer, whereas in PTLP bonding it may consist of multiple layers (see FIGS. 3-5 and further details below). Following application of the interlayer, both the TLP bonding and PTLP bonding processes may involve the progressive heating of the interlayer 30 to a bonding temperature. Prior to reaching the bonding temperature, the interlayer 30 may at least partially melt/liquefy by direct or eutectic melting. Upon reaching the bonding temperature, isothermal solidification may occur until all of the liquid has solidified. As explained in the following paragraphs, additional details of the TLP bonding and PTLP bonding mechanisms may vary depending on which bonding process is used (TLP bonding or PTLP bonding), as well as on the material composition (e.g., metallic or nonmetallic) forming the compliant attachment 18.

Referring now to FIG. 3, an exemplary interlayer 30 for bonding the body portion 12 to a compliant attachment 18 formed from a nonmetallic material 34 by TLP bonding is depicted. In this case, the interlayer 30 may exist as one of the above-described bonding material formats (i.e., foil, powder, sputtered layer, etc.) and it may be formed from a metallic material. During the TLP bonding process, at least one reactive element from the liquefied portion of the interlayer 30 may wet/adhere to the nonmetallic material 34 of the compliant attachment 18 and at least one reactive element from the interlayer 30 may diffuse into the metallic layer 28 to form a bond therebetween.

Figure 4:
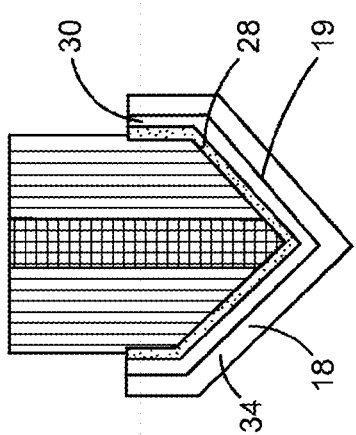
FIG. 4 is a cross-sectional view similar to FIG. 3, but showing another interlayer for bonding the body portion of the OMC component to the compliant attachment by transient liquid phase bonding, constructed in accordance with the present disclosure.

An exemplary interlayer 30 for joining the body portion 12 to a compliant attachment 18 formed from a metallic material 35 by TLP bonding is shown in FIG. 4. In this case, the interlayer 30 may consist of a metallic material and it may exist as one of the above-described bonding material formats (i.e., an alloy foil, powder, braze paste, etc.). During the TLP bonding process, at least one reactive element from the interlayer 30 may diffuse into the compliant attachment 18 and at least one reactive element from the interlayer may diffuse into the metallic layer 28 to form a bond between the body portion 12 and the compliant attachment 18.

Figure 5:
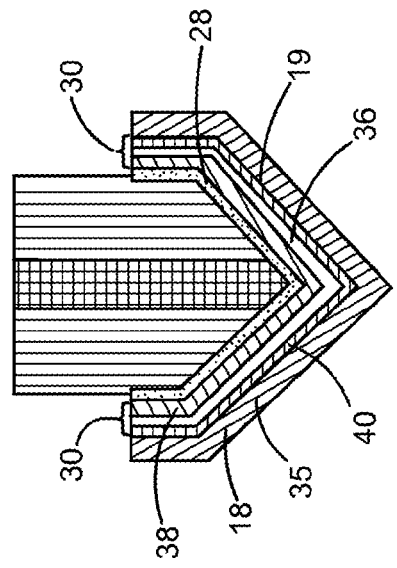
FIG. 5 is a cross-sectional view similar to FIG. 4, but showing an interlayer for bonding the body portion of the OMC component to the compliant attachment by partial transient liquid phase bonding, constructed in accordance with the present disclosure.

FIG. 5 shows an exemplary interlayer 30 for joining the body portion 12 to a compliant attachment 18 formed from a metallic material 35 by PTLP bonding. As shown, the interlayer 30 may consist of multiple layers including a refractory core 36 between two thinner layers which may include an upper layer 38 and a lower layer 40. Alternatively, multiple thinner layers may exist on each side of the refractory core 36. The refractory core 36 may consist of a pure metal or an alloy, and the upper layer 38 and the lower layer 40 may have the same metallic composition or different metallic compositions to provide an asymmetric bond set-up. In addition, the refractory core 36 has a higher melting temperature than the upper layer 38 and the lower layer 40 such that it does not melt during the PTLP bonding process. Furthermore, the refractory core 36, the upper layer 38, and the lower layer 40 may each exist as any one of the above-described bonding material formats. During the PTLP bonding process, the upper layer 38 and the lower layer 40 may melt (by direct melting or by eutectic melting if a eutectic product is formed between the thinner layers and the refractory core or the substrate materials) and isothermally solidify as described above. During these stages, the upper layer 38 and the lower layer 40 may diffuse into the refractory core 36 and at least one reactive element from the upper layer 38, the lower layer 40, and/or the refractory core 36 may diffuse into the compliant attachment 18 and the metallic layer 28 to form a bond therebetween. If the compliant attachment 18 is formed from a nonmetallic material, the PTLP bonding mechanism may be the same as that described above except the reactive material(s) may wet/adhere to the nonmetallic materials of the compliant attachment 18, rather than diffuse into it during the PTLP bonding process.

If adhesive bonding is used to attach the compliant attachment 18 to the interfacing surface 14, the selected adhesive may contain insulating materials to assist in providing thermal protection to the OMC component 10 in higher temperature environments. In addition, in some cases, the adhesive may have a CTE intermediate between the CTE of the compliant attachment 18 and the body portion 12 to further assist in transitioning thermal properties between the mating component 16 and the body portion 12 of the OMC component 10. However, the adhesive used for bonding the compliant attachment 18 to the interfacing surface 14 may be selected from various other types of structural adhesives as well.

As another possible bonding arrangement, the compliant attachment 18 may be bonded to one or more molded inserts 42 on the interfacing surface 14 of the body portion 12, as shown in FIG. 6. In this case, the compliant attachment 18 may be bonded to an exposed surface 43 of the molded insert(s) 42 by adhesive bonding, TLP bonding, PTLP bonding, or brazing, as described in detail above. Moreover, if TLP bonding, PTLP bonding, or brazing is used as a bonding method, the exposed surface(s) 43 of the molded insert(s) 42 may first be plated with one or more metallic layers before the bonding step. The molded insert(s) 42 may be formed from any suitable material such as, but not limited to, a composite material such as a laminated structure or a 3D woven composite, injected molded plastic, or various polymeric compositions. The molded insert(s) 42 may also be formed from a metallic material. In some arrangements, the molded insert(s) 42 may have thermal properties (CTE in particular) intermediate between the compliant attachment 18 and the body portion 12 to further assist transitioning thermal properties from the mating component 16 to the body portion 12.

The laminate composition of the body portion 12 may also be tuned to provide a smooth transition of thermal properties. For example, as shown in FIG. 7, the laminated structure 22 may consist of a series of sub-laminates 44 that provide a gradient of CTEs (such as from a low CTE to a high CTE) between the compliant attachment 18 and a central core 45 of the body portion 12. As one possibility, an outermost sub-laminate 46 may have a CTE intermediate between the CTE of the complaint attachment 18 and a CTE of a central sub-laminate 48, and the CTE of the central sub-laminate 48 may be intermediate between the CTE of the outermost sub-laminate 46 and a CTE of a core sub-laminate 50. As will be understood, the number of sub-laminates 44 and their relative positions and their respective CTEs may vary depending on a number of design factors.

As another possibility, two or more compliant attachments 18 may be bonded to the interfacing surface 14 to provide a smoother CTE gradient between the mating structure 16 and the body portion 12 of the OMC component, as shown in FIG. 8. For example, in the arrangement depicted in FIG. 8, the compliant attachment 18 may have a CTE intermediate between the CTE of the body portion 12 and a CTE of a second compliant attachment 52 bonded to its outer surface 20, and the second compliant attachment 52 may have a CTE intermediate between the CTE of the mating component 16 and the CTE of the compliant attachment 18. It will be understood that variations such as these as well as combinations with the various arrangements described above are also considered within the scope of this disclosure.

Figure 9:
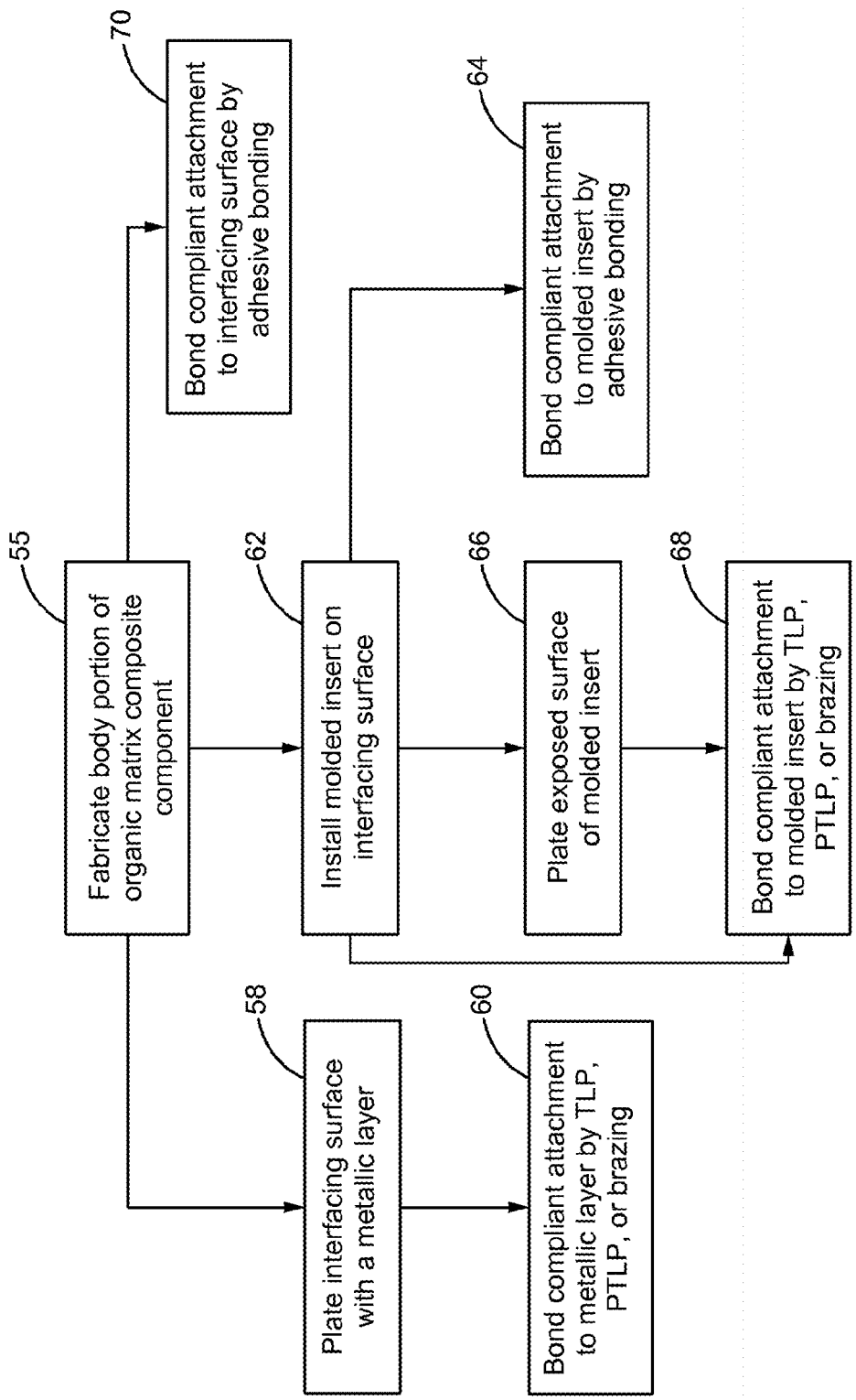
FIG. 9 is a flowchart depicting sample sequences which may be involved in fabricating the OMC component, in accordance with a method of the present disclosure.

Several possible methods which may be used to fabricate the OMC component 10 are depicted in FIG. 9. According to a first block 55, the body portion 12 of the OMC component 10 may be fabricated. This may be achieved by curing/shaping stacked laminae and/or 3D woven fibers in a polymer matrix by a conventional process apparent to those skilled in the art such as, but not limited to, room temperature curing, vacuum bagging, autoclaving, compression molding, and resin transfer molding. If the compliant attachment 18 is to be bonded to the body portion 12 by TLP bonding, PTLP bonding, or brazing, the interfacing surface 14 may then be plated with one or metallic layers 28 according to a next block 58, as shown. The block 58 may be carried out using known metal deposition processes (i.e., electrolytic plating, electroless plating, physical vapor deposition, chemical vapor deposition, cold spraying, powder metal deposition, etc.) after suitable activation and metallization of the interfacing surface 14 using established techniques. Following the deposition of the metallic layer(s) 28, the compliant attachment 18 may then be bonded to the metallic layer 28 by TLP bonding, PTLP bonding, or brazing according to the processes described in detail above (block 60) to provide the OMC component 10.

Alternatively, following fabrication of the body portion 12 by the block 55, one or more molded inserts 42 may be installed on the interfacing surface 14 of the body portion 12 according to a block 62. Installation of the molded insert(s) 42 on the interfacing surface 14 may be carried out using an adhesive. Alternatively, the molded insert(s) 42 may be incorporated into the body portion 12 during its fabrication (i.e., during the layup process). The compliant attachment 18 may then be adhesively bonded to the exposed surface(s) 43 of the molded insert(s) 42 according to the block 64. Alternatively, the exposed surface(s) 43 of the molded insert(s) 42 may be plated with one or more metallic layers according to a block 66 and the compliant attachment 18 may then be bonded to the molded insert(s) by TLP bonding, PTLP bonding, or brazing according to a next block 68 to provide the OMC component 10. However, if the molded insert(s) 42 are formed from a metallic material, then the block 66 may be bypassed, and the molded insert(s) 42 may be directly bonded to the compliant attachment 18 by TLP bonding, PTLP bonding, or brazing, as shown.

As another possible fabrication route, the compliant attachment 18 may be adhesively bonded to the interfacing surface 14 of the body portion 12 according to a block 70 following the block 55, as shown.

INDUSTRIAL APPLICABILITY

In general, it can therefore be seen that the technology disclosed herein may have industrial applicability in a variety of settings including, but not limited to, applications requiring robust connections between OMC components and mating components having thermal and/or compliance mismatches. In particular, the present disclosure introduces an OMC component having a compliant attachment which interfaces with a mating component and accommodates thermal expansion mismatching between the OMC component and the mating component. The compliant attachment may have thermal properties intermediate between the thermal properties of the body portion of the OMC component and the mating component. By virtue of such properties, the compliant attachment may alleviate or absorb thermally-induced strain at the contact interface, improve the robustness of the connection between the OMC component and the mating structure, and possibly increase the performance and operative lifetime of the OMC component. Furthermore, as disclosed herein, the compliant attachment may be bonded to the interfacing surface of the OMC component by TLP bonding or PTLP bonding to provide a structurally resilient bond having a relatively high melting temperature. It is expected that the technology disclosed herein may find wide industrial applicability in areas such as, but not limited to, aerospace, automotive, and sporting applications.

What is claimed:

1. An organic matrix composite component, being an airfoil and comprising:
  a body portion formed from an organic matrix composite and having a component root portion configured to engage in a mechanical connection with a slot of a hub; and
  a compliant attachment bonded to the root portion of the body portion and having a coefficient of thermal expansion intermediate between a coefficient of thermal expansion of the body portion and a coefficient of thermal expansion of the slot of the hub, wherein the component root portion of the body portion comprises at least one molded insert having a coefficient of thermal expansion between those of the compliant attachment and the body portion.

2. The organic matrix composite component according to claim 1, wherein an exposed surface of the at least one molded insert is plated with at least one metallic layer.

3. The organic matrix composite component according to claim 2, wherein the compliant attachment is bonded to the at least one molded insert by a bonding method selected from the group consisting of transient liquid phase bonding, partial transient liquid phase bonding, and brazing.

4. The organic matrix composite component according to claim 1, wherein the compliant attachment is bonded to the at least one molded insert by adhesive bonding.

5. The organic matrix composite component according to claim 1, further comprising a second compliant attachment bonded to an outer surface of the compliant attachment and have a coefficient of thermal expansion intermediate between the coefficient of thermal expansion of the compliant attachment and the coefficient of thermal expansion of the slot of the hub.

6. The organic matrix composite component according to claim 1, wherein the organic matrix composite comprises a laminated structure.

7. The organic matrix composite component according to claim 6, wherein the organic matrix composite further comprises a 3D woven composite.

8. A gas turbine engine component, comprising the organic matrix component of claim 1.

9. The gas turbine engine component according to claim 8, wherein an exposed surface of the at least one molded insert is plated with at least one metallic layer.

10. The gas turbine engine component according to claim 9, wherein the compliant attachment is bonded to the at least one molded insert by a bonding method selected from the group consisting of transient liquid phase bonding, partial transient liquid phase bonding, and brazing.

11. The gas turbine engine component according to claim 8, wherein the compliant attachment is bonded to the at least one molded insert by adhesive bonding.

12. A method for fabricating an organic matrix composite component being an airfoil configured to interface with a slot of a hub, comprising:

- fabricating a body portion of the organic matrix composite component wherein the body portion has a root portion;
- installing at least one molded insert on the root portion; and
- bonding a compliant attachment to the at least one molded insert, the compliant attachment having a coefficient of thermal expansion intermediate between a coefficient of thermal expansion of the body portion and a coefficient of thermal expansion of the slot of the hub and the at least one molded insert having a coefficient of thermal expansion intermediate between those of the compliant attachment and the body portion.

13. The method according to claim 12, further comprising plating the at least one molded insert with at least one metallic layer prior to bonding the compliant attachment to the interfacing surface.

14. The method according to claim 13, wherein bonding the compliant attachment is performed using a bonding method selected from the group consisting of transient liquid phase bonding, partial transient liquid bonding, and brazing.

* * * * *